United States Patent
Kim et al.

(10) Patent No.: US 9,418,744 B2
(45) Date of Patent: Aug. 16, 2016

(54) SYSTEM AND METHOD TO REDUCE DISTURBANCES DURING PROGRAMMING OF FLASH MEMORY CELLS

(71) Applicant: Silicon Storage Technology, Inc., San Jose, CA (US)

(72) Inventors: Jinho Kim, Saratoga, CA (US); Anh Ly, San Jose, CA (US); Victor Markov, Santa Clara, CA (US)

(73) Assignee: SILICON STORAGE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 14/275,362

(22) Filed: May 12, 2014

(65) Prior Publication Data

US 2015/0325300 A1 Nov. 12, 2015

(51) Int. Cl.
| | | |
|---|---|---|
| *G11C 16/04* | (2006.01) | |
| *G11C 16/08* | (2006.01) | |
| *G11C 16/34* | (2006.01) | |
| *G11C 8/10* | (2006.01) | |
| *G11C 7/02* | (2006.01) | |
| *G11C 16/14* | (2006.01) | |

(52) U.S. Cl.
CPC *G11C 16/14* (2013.01); *G11C 7/02* (2013.01); *G11C 8/10* (2013.01); *G11C 16/0408* (2013.01); *G11C 16/0425* (2013.01); *G11C 16/08* (2013.01); *G11C 16/3427* (2013.01)

(58) Field of Classification Search
CPC .... G11C 16/14; G11C 16/0408; G11C 16/08; G11C 7/02; G11C 16/0425; G11C 8/10; G11C 16/3427
See application file for complete search history.

(56) References Cited

U.S. PATENT DOCUMENTS

| | | | | |
|---|---|---|---|---|
| 5,034,926 A | * | 7/1991 | Taura et al. | 365/185.14 |
| 5,418,742 A | * | 5/1995 | Asano | 365/185.02 |
| 5,579,259 A | * | 11/1996 | Samachisa et al. | 365/185.14 |
| 7,495,958 B2 | | 2/2009 | Chih | |
| 7,495,960 B2 | | 2/2009 | Chih | |
| 7,839,682 B2 | * | 11/2010 | Tran et al. | 365/185.05 |
| 8,325,521 B2 | | 12/2012 | Hsieh | |
| 2006/0274577 A1 | * | 12/2006 | Pascucci et al. | 365/185.17 |
| 2008/0068887 A1 | | 3/2008 | Chih | |
| 2008/0123416 A1 | | 5/2008 | Chih | |
| 2009/0196103 A1 | * | 8/2009 | Kim | 365/185.12 |
| 2012/0087188 A1 | | 4/2012 | Hsieh | |
| 2014/0104965 A1 | * | 4/2014 | Tran et al. | 365/189.011 |

OTHER PUBLICATIONS

PCT Search Report dated Jun. 26, 2015 corresponding to the related PCT Patent Application No. US2015/026809.

* cited by examiner

*Primary Examiner* — J. H. Hur

(74) *Attorney, Agent, or Firm* — Brent Yamashita; DLA Piper LLP US

(57) ABSTRACT

An improved control gate decoding design may reduce disturbances during the programming of flash memory cells. In one embodiment, a control gate line decoder is coupled to a first control gate line associated with a row of flash memory cells in a first sector and to a second control gate line associated with a row of flash memory cells in a second sector.

20 Claims, 3 Drawing Sheets

SYSTEM AND METHOD TO REDUCE DISTURBANCES DURING PROGRAMMING OF FLASH MEMORY CELLS

TECHNICAL FIELD

An improved control gate decoding design for reducing disturbances during the programming of flash memory cells is disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. Another embodiment for erase is by applying a positive voltage Vegp on the erase gate EG 6, a negative voltage Vcgn on the coupling gate CG 7, and applying a zero voltages on other terminals. The negative voltage Vcgn couples negatively the floating gate FG 5, hence less positive voltage Vcgp is required for erasing. Electrons tunnel from the floating gate FG 5 into the erase gate EG 6 causing the floating gate FG 5 to be positively charged, turning on the cell 10 in a read condition (cell state '1'). Alternatively, the wordline WL 8 (Vwle) and the source line SL 2 (Vsle) can be negative to further reduce the positive voltage on the erase gate FG 5 needed for erase. The magnitude of negative voltage Vwle and Vsle in this case is small enough not to breakdown the surrounding oxide and not to forward the p/n junction.

The cell 10 is programmed, through a source side hot electron programming mechanism, by applying a high voltage on the coupling gate CG 7, a high voltage on the source line SL 2, a medium voltage or a voltage that is the same as the source line voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. A split gate flash memory operation and various circuitry are described in U.S. Pat. No. 7,990,773, "Sub Volt Flash Memory System," by Hieu Van Tran, et al, and U.S. Pat. No. 8,072,815, "Array of Non-Volatile Memory Cells Including Embedded Local and Global Reference Cells and Systems," by Hieu Van Tran, et al, which are incorporated herein by reference.

With reference to FIG. 2, flash memory cells of the type shown in FIG. 1 are arranged in an array. A row of flash memory cells is selected using a word line, and a column of flash memory cells is selected using a bit line. A specific flash memory cell is selected using a combination of a word line and a bit line. Flash memory cells are further arranged into sectors. The flash memory cells within a particular sector share an erase gate control line, and all flash memory cells within a particular sector are erased at the same time using the erase gate control line. The flash memory cells within a particular sector also share a source line. Flash memory cells within a particular row also share a control gate line.

In the illustrative example of FIG. 2, two sectors of flash memory cells are shown. It is to be understood that a flash memory array can include any number of sectors and that each sector can include any number of rows and columns of flash memory cells. In this example, each flash memory cell shown (201, 202, 203, 211, 212, 213, 221, 222, 223, 231, 232, and 233) follow the design of FIG. 1.

Sector 150 comprises cell 201, cell 202, and cell 203 in a row accessed by word line 151 and control gate 251 and cell 211, cell 212, and cell 213 in a row accessed by word line 152 and control gate 252. Sector 160 comprises cell 221, cell 222, and cell 223 in a row accessed by word line 161 and control gate 261 and cell 231, cell 232, and cell 233 in a row accessed by word line 162 and control gate 162. The cells in sector 150 are erased by erase gate line 155, and the cells in sector 160 are erased by erase gate line 165. The cells in sector 150 are coupled to source line 156, and the cells in sector 160 are coupled to source line 166.

For each cell, its respective bit line (101, 102, or 103) is attached to bit line 9 in FIG. 1, its word line (151, 152, 161, or 162) is attached to word line 8 in FIG. 1, its erase gate line (155 or 165) is attached to erase gate 6 in FIG. 1, its control gate line (251, 252, 261, or 262) is attached to control gate 7 in FIG. 1, and its source line (156 or 166) is coupled to source line 2 in FIG. 1.

In the prior art system of FIG. 2, two or more control gate lines within each sector are coupled to a control gate line decoder. Thus, in FIG. 2, control gate line 251 and control gate line 252 are coupled to control gate line decoder 250, and control gate line 261 and control gate line 262 are coupled to control gate line decoder 260. Control gate line decoder 250 can be coupled to control gate voltage source 255, and control gate line decoder 260 can be coupled to control gate voltage source 265. If, for example, the system desires to activate control gate line 252, it will configure control gate line decoder 250 to couple control gate line 252 to control gate voltage source 255. This configuration can occur using a selection signal (not shown) sent to control gate line decoder 250.

One undesired consequence of this prior art design is that disturbances will emerge during the programming process of flash memory cells due to the use of control gate line decoders within sectors. For example, if cell 212 is to be programmed, word line 152 and bit line 102 will be activated, and source line 156 will contain a high voltage. Control line decoder 250 will couple control gate line 252 to control gate voltage source 255. In actual operation, some charge will leak from control gate voltage source 255 through control line decoder 250 to control gate line 251. This will have the unintended consequence of sometimes programming cell 202 (known as a column disturbance) due to its sharing of bit line 102 and source line 156 with cell 212, and of sometimes programming cell 203 (known as a diagonal disturbance) and possibly other cells in sector 150 due to their sharing of source line 156 with cell 212. In addition, cell 213 also will sometimes be unintentionally programmed (known as a row disturbance) due to its sharing of word line 152, control gate line 252, and source line 156 with cell 212.

What is needed is an improved system that minimizes the occurrences of disturbances during the programming of flash memory cells.

SUMMARY OF THE INVENTION

An embodiment is described whereby control gate line decoders are coupled to rows of flash memory cells located in different sectors instead of the same sector. This embodiment reduces the occurrence of column disturbances and diagonal disturbances found in the prior art.

DETAILED DESCRIPTION OF THE PREFERRED EMBODIMENTS

Figure 1:
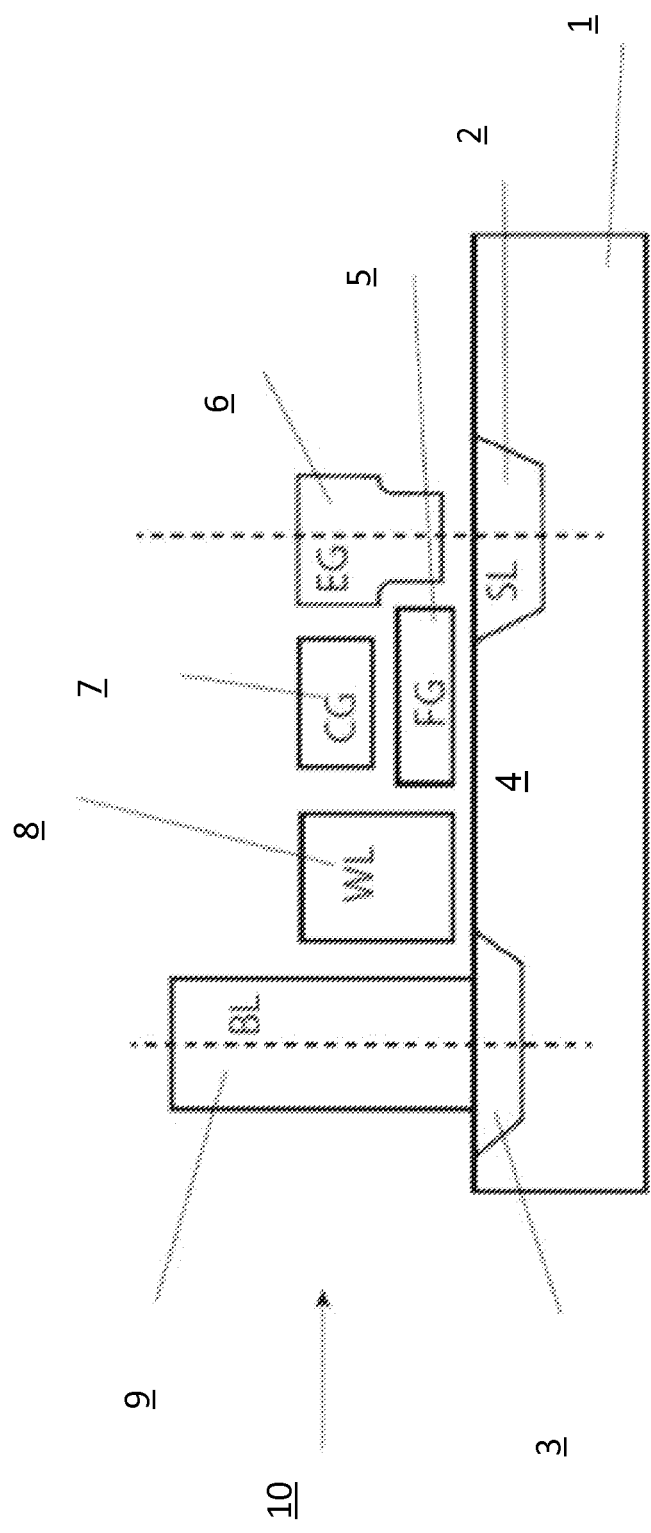
FIG. 1 depicts a prior art split gate flash memory cell.
Figure 2:
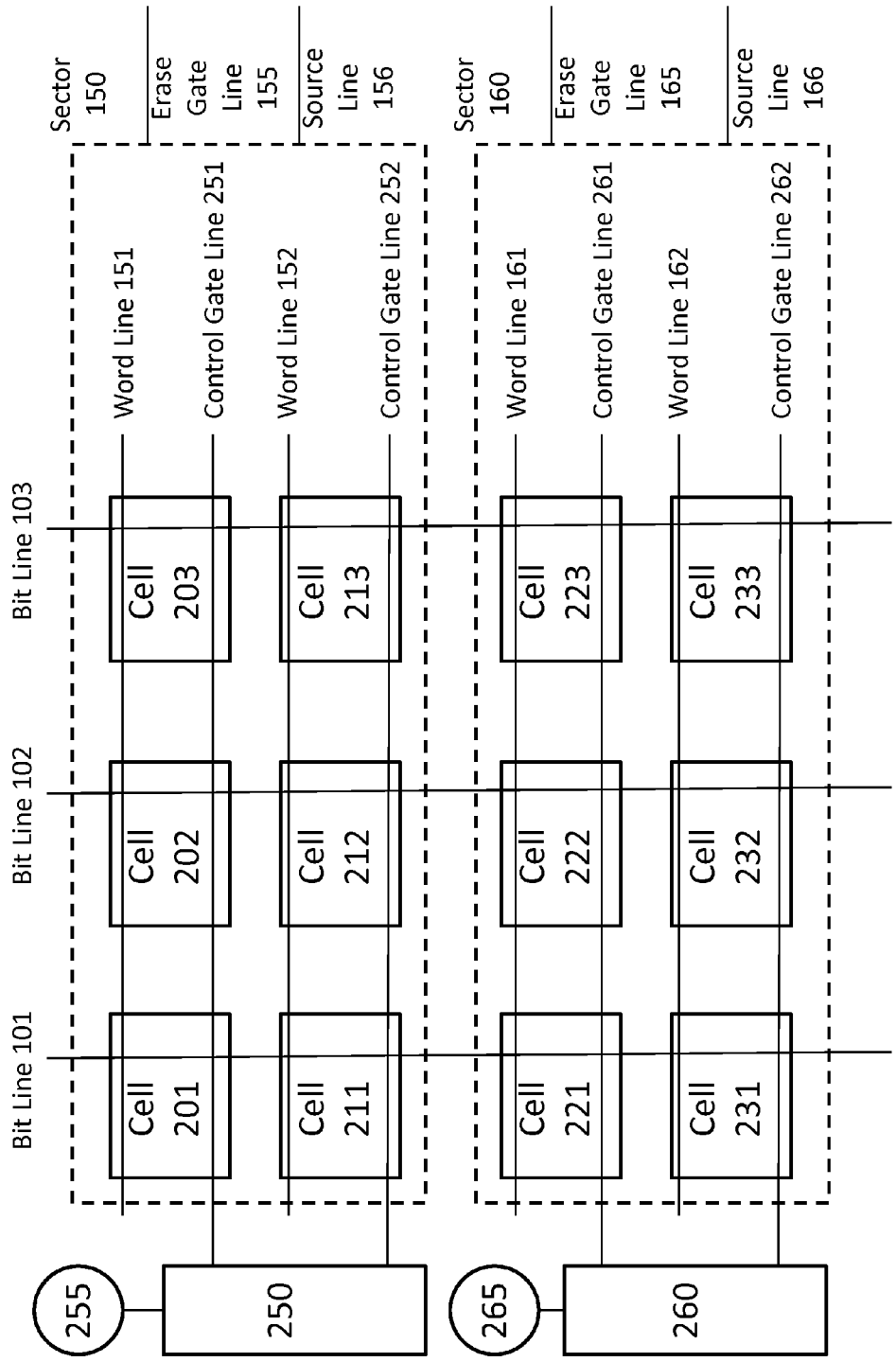
FIG. 2 depicts a layout of a prior art flash memory array.
Figure 3:
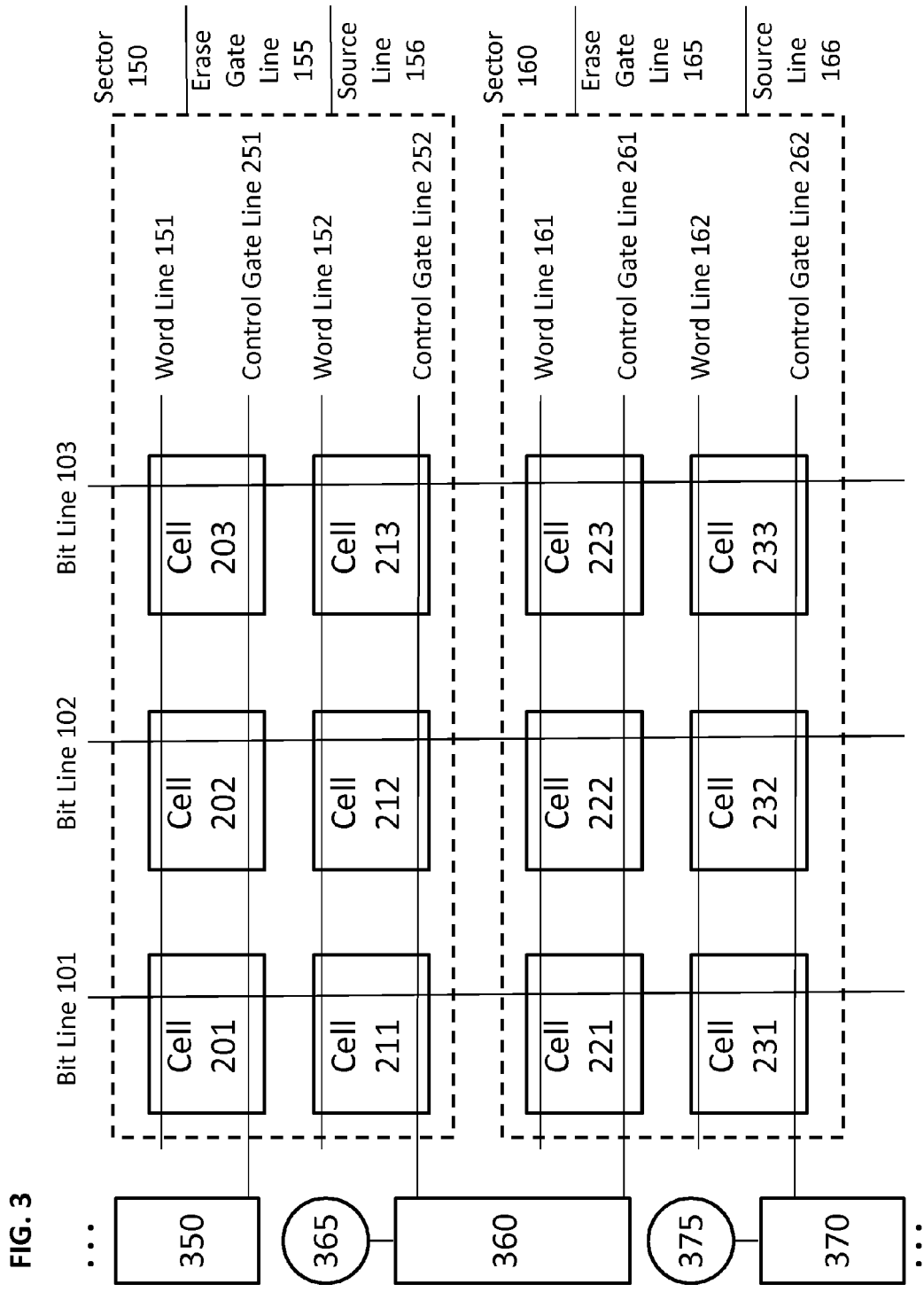
FIG. 3 depicts an exemplary layout of an embodiment of a flash memory array.

With reference to FIG. 3, an embodiment is depicted. FIG. 3 shares many of the same elements depicted in FIG. 2, and elements that use the same numbering as in FIG. 2 are the same elements described previously for FIG. 2. In FIG. 3, control gate line decoder 360 is coupled to control gate line 252 and control gate line 261. Control gate line 252 is in sector 150, and control gate line 261 is in sector 160. Control gate line decoder 360 can be coupled to control gate voltage source 365. Control gate line decoder 350 is coupled to control gate line 251 and another control gate line (not shown) in a different sector. Control gate line decoder 370 is coupled to control gate line 262 and another control gate line (not shown) in a different sector. Control gate line decoder 370 can be coupled to control gate voltage source 375.

If cell 212 is to be programmed, word line 152 and bit line 102 will be activated, and source line 156 will contain a high voltage. Control line decoder 360 will couple control gate line 252 to control gate voltage source 365. In actual operation, some charge will leak from control gate voltage source 365 through control line decoder 360 to control gate line 261. However, because source line 166 is at a low voltage (because sector 160 is not being programmed), none of the cells associated with control gate line 261 will be unintentionally programmed. Thus, the column disturbance of FIG. 2 is not present in the design of FIG. 3. Similarly, the diagonal disturbances of FIG. 2 are not present in FIG. 3.

Thus, by associating each control gate line decoder with control gate lines in different sectors, the unintended programming disturbance of the prior art can be avoided.

Although the embodiment of FIG. 3 shows each control gate line decoder coupled to two control gate lines, with each control gate line being in a different sector, one of ordinary skill in the art will appreciate that in the alternative each control gate line decoder instead could be coupled to more than two control gate lines, with each control gate line being in a different sector. The same principles of the embodiment of FIG. 3 would apply.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A flash memory system, comprising:
   a first sector comprising a first plurality of rows of flash memory cells, the first sector associated with a first source line;
   a second sector comprising a second plurality of rows of flash memory cells, the second sector associated with a second source line; and
   a control gate line decoder coupled to a control gate voltage source and selectively coupled to only one control gate line associated with one of the first plurality of rows and only one control gate line associated with one of the second plurality of rows, wherein one of the first and second source lines is at a high voltage and the other of the first and second source lines is at a low voltage.

2. The flash memory system of claim 1, wherein the first sector is associated with a first erase gate line and the second sector is associated with a second erase gate line.

3. The flash memory system of claim 1, wherein each of the first plurality of rows is associated with a different control gate line.

4. The flash memory system of claim 3, wherein each of the second plurality of rows is associated with a different control gate line.

5. The flash memory system of claim 1, wherein the first plurality of rows of flash memory cells and the second plurality of rows of flash memory cells each comprise split gate flash memory cells.

6. The flash memory system of claim 2, wherein the first plurality of rows of flash memory cells and the second plurality of rows of flash memory cells each comprise split gate flash memory cells.

7. The flash memory system of claim 3, wherein the first plurality of rows of flash memory cells and the second plurality of rows of flash memory cells each comprise split gate flash memory cells.

8. The flash memory system of claim 4, wherein the first plurality of rows of flash memory cells and the second plurality of rows of flash memory cells each comprise split gate flash memory cells.

9. A method of programming a flash memory cell, comprising:
  activating a selected flash memory cell in a first row in a first sector using a first word line and a first bit line, the first sector associated with a first source line;
  coupling a control gate voltage source to a control gate of the selected flash memory cell using a control gate line decoder wherein the control line decoder cannot be selectively coupled to another row within the first sector, wherein the control gate line decoder can be selectively coupled to only one row of flash memory cells in a second sector, the second sector associated with a second source line, wherein the first source line is at a high voltage and the second source line is at a low voltage; and
  storing a digital value in a floating gate of the selected flash memory cell.

10. The method of claim 9, further comprising erasing the selected flash memory cell using an erase gate line.

11. The method of claim 9, wherein the selected flash memory cell is a split gate flash memory cell.

12. The method of claim 10, wherein the selected flash memory cell is a split gate flash memory cell.

13. A method of programming and reading a flash memory cell, comprising:
  activating a selected flash memory cell in a first row in a first sector using a first word line and a first bit line, the first sector associated with a first source line;
  coupling a control gate voltage source to the first row using a control gate line decoder wherein the control gate voltage source cannot be selectively coupled to another row in the first sector, wherein the control gate line decoder can be selectively coupled to only one row in a second sector, the second sector associated with a second source line, wherein the first source line is at a high voltage and the second source line is at a low voltage;
  storing a digital value in a floating gate of the selected flash memory cell; and
  reading the digital value using a source line of the selected flash memory cell.

14. The method of claim 13, wherein the storing step comprises adding electrons to the floating gate.

15. The method of claim 13, further comprising erasing the selected flash memory cell using an erase gate line.

16. The method of claim 15, wherein the erasing step comprises removing electrons from the floating gate.

17. The method of claim 13, wherein the first row comprises split gate flash memory cells.

18. The method of claim 14, wherein the first row comprises split gate flash memory cells.

19. The method of claim 15, wherein the first row comprises split gate flash memory cells.

20. The method of claim 16, wherein the first row comprises split gate flash memory cells.

\* \* \* \* \*